(12) United States Patent
Feng et al.

(10) Patent No.: US 10,847,430 B2
(45) Date of Patent: *Nov. 24, 2020

(54) METHOD OF FEATURE EXACTION FROM TIME-SERIES OF SPECTRA TO CONTROL ENDPOINT OF PROCESS

(71) Applicant: Lam Research Corporation, Fremont, CA (US)

(72) Inventors: Ye Feng, Portland, OR (US); Prashanth Kumar, Fremont, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/386,234

(22) Filed: Apr. 16, 2019

(65) Prior Publication Data

US 2019/0244870 A1    Aug. 8, 2019

Related U.S. Application Data

(63) Continuation of application No. 15/389,451, filed on Dec. 23, 2016, now Pat. No. 10,262,910.

(51) Int. Cl.
*H01L 21/66* (2006.01)
*H01L 21/67* (2006.01)
*H01J 37/32* (2006.01)
*G06F 9/30* (2018.01)
*H01L 21/02* (2006.01)
*H01L 21/027* (2006.01)

(52) U.S. Cl.
CPC ........ *H01L 22/26* (2013.01); *H01J 37/32926* (2013.01); *H01J 37/32963* (2013.01); *H01J 37/32972* (2013.01); *H01L 21/67259* (2013.01); *H01L 22/00* (2013.01); *H01L 22/12* (2013.01); *H01L 22/24* (2013.01)

(58) Field of Classification Search
None
See application file for complete search history.

(56) References Cited

U.S. PATENT DOCUMENTS

| | | | |
|---|---|---|---|
| 6,582,618 B1 | 6/2003 | Toprac | 216/59 |
| 2003/0043383 A1 | 3/2003 | Usui | 356/504 |

*Primary Examiner* — Stephanie P Duclair
(74) *Attorney, Agent, or Firm* — Penilla IP, APC

(57) ABSTRACT

Methods and systems for using a time-series of spectra to identify endpoint of an etch process. One method includes accessing a virtual carpet that is generated from a time-series of spectra for an etch process. A polynomial with coefficients represents the virtual carpet. The method includes processing a fabrication etch process on a fabrication wafer and generating a carpet defined from a time-series of spectra while processing the fabrication etch process. While the processing the fabrication etch process and generating the carpet, comparing portions of the carpet and the virtual carpet to identify an endpoint metric of the fabrication etch process.

15 Claims, 11 Drawing Sheets

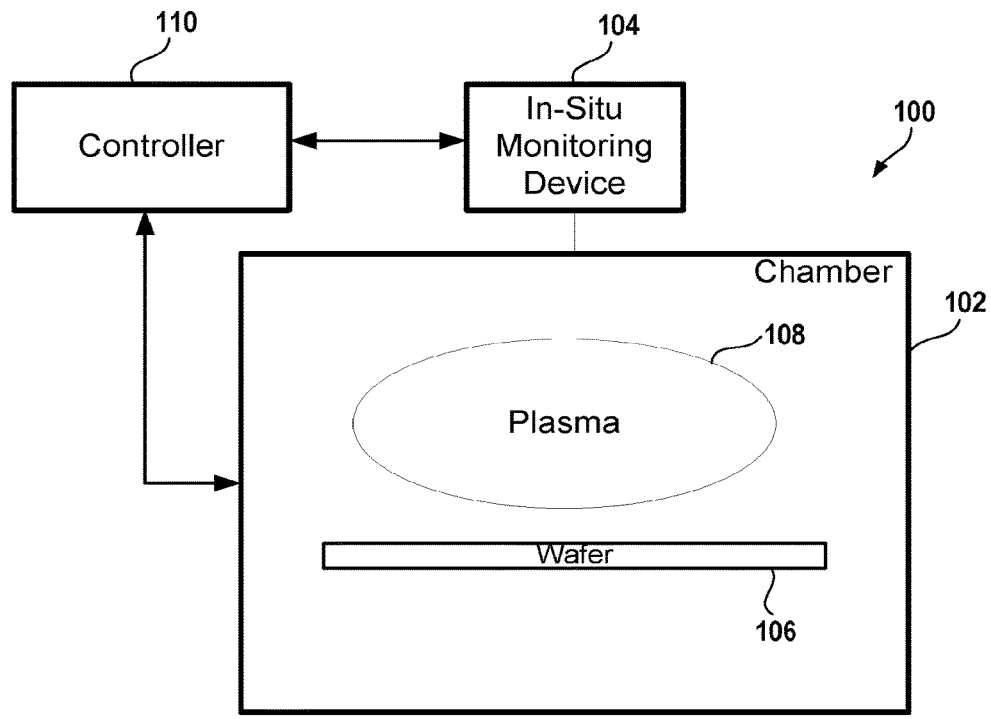
FIG. 1
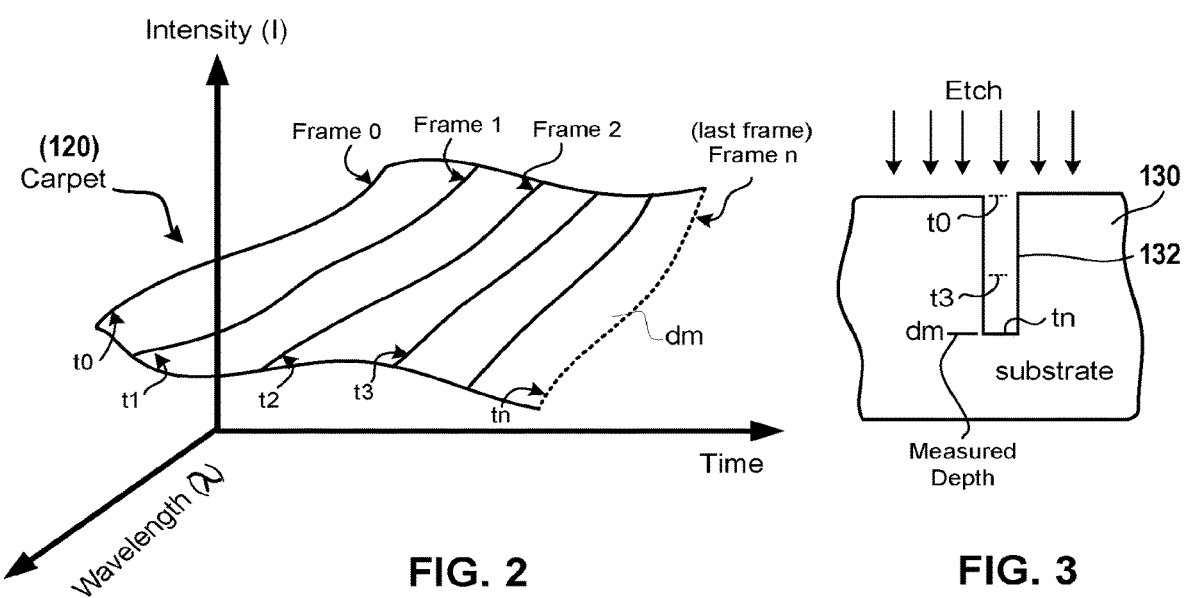
FIG. 2
FIG. 3

| Frame # | Time |
|---|---|
| Frame 0 | t0 |
| Frame 1 | t1 |
| Frame 2 | t2 |
| Frame 3 | t3 |
| ⋮ | ⋮ |
| Frame 467 | Tn |

(230) Real Frame Samples

231 — Measured etch depth or other parameter
232

| Virtual Frame # (VF#) | Time |
|---|---|
| Virtual Frame 0 | t0 |
| Virtual Frame 1 | t1 |
| Virtual Frame 2 | t2 |
| Virtual Frame 3 | t3 |
| ⋮ | ⋮ |
| Virtual Frame 300 | tn |

(240) Virtual Frame Samples 241
242

| wafer | a11 | a12 | a13 | a14 | a21 | a22 | a23 | a24 | a31 | a32 | a33 | a34 |
|---|---|---|---|---|---|---|---|---|---|---|---|---|
| 1 | 8.248223 | 3.292665 | -18.1317 | 0.676785 | 5.636064 | 6.0145 | -34.068 | -8.29946 | 3.693116 | -9.3964 | 27.82655 | 174.2935 |
| 2 | 5.519548 | 4.815763 | -13.5498 | 1.006829 | 5.663605 | 8.478308 | -34.749 | -9.2152 | 4.741054 | -8.57274 | 22.71838 | 176.1632 |
| 3 | 9.770316 | 1.840332 | -20.308 | 0.742698 | 6.64429 | 4.899732 | -35.3597 | -8.59883 | 3.897872 | -9.75289 | 28.91738 | 174.7949 |
| 4 | 3.689449 | 6.104803 | -11.2052 | 2.145745 | 8.432356 | 11.64032 | -41.8853 | -8.86482 | 7.219508 | -8.04647 | 12.25645 | 171.089 |
| 5 | 7.445223 | 4.534386 | -17.3111 | 1.15753 | 7.757291 | 7.923665 | -39.1526 | -8.1711 | 4.970061 | -9.04191 | 22.26768 | 172.7058 |
| average | 6.934552 | 4.11759 | -16.1012 | 1.145917 | 6.826721 | 7.791305 | -37.0429 | -8.62988 | 4.904322 | -8.96208 | 22.79729 | 173.8093 |

METHOD OF FEATURE EXACTION FROM TIME-SERIES OF SPECTRA TO CONTROL ENDPOINT OF PROCESS

CLAIM OF PRIORITY

This application is a Continuation of U.S. patent application Ser. No. 15/389,451, filed on Dec. 23, 2016 (now U.S. Pat. No. 10,262,910, issued on Apr. 16, 2019) entitled "METHOD OF FEATURE EXACTION FROM TIME-SERIES OF SPECTRA TO CONTROL ENDPOINT OF PROCESS", which is hereby incorporated by reference.

FIELD OF THE INVENTION

The present embodiments relate to methods and computer implemented processes for examining time-series of spectra information extracted during processing of etch processing operations in order control etch endpoint operations. The methods and systems utilize training processes to generate three dimensional intensity surface profiles, referred to herein as carpets. Generated carpets during training are then converted into a virtual carpet, which is used during real-time processing of wafers to predict or identify an effective etch depth at a current point in time, which is then used to determine whether etch endpoints have been reached.

BACKGROUND

Plasma has long been employed to process substrates (e.g., wafers or flat panels) to form electronic products (e.g., integrated circuits or flat panel displays). Semiconductor wafers are typically placed in an etch chamber with a mask layer to direct the etch of underlying materials. The etching process removes the underlying materials not covered by the mask. Although etching processes have been well studied and precise recipes are often defined for specific structures, materials and/or material stacks, variations in etch performance still occur. The reason for this is that etching processes in real-time fabrication environments are carried out in different etch chambers. These chambers, although often times tuned and matched, still are not the physically or electrically the same. In addition, wafers being processed can vary from wafer to wafer or lot to lot. Still further, variations can be introduced by the way wafers are placed into each chamber, e.g., wafer off-set variations, wafer tilts, wafer thickness, etc.

As a result, wafer etching processes often utilize at least one type of end pointing technique. Such techniques can vary from fabricator to fabricator, but most commonly used end pointing may include time based end-pointing or optical end-pointing. Time based end-pointing relies on use of pre-calibrated estimates of when a particular etch process should end, e.g., so as to remove a predefined amount of material. Optical end-pointing systems are designed to monitor spectral emissions of the plasma or reflections off the wafer, in an attempt to identify when changes in the spectral emissions are indicative of a change of etch material. For example, if the etch has removed all of a certain amount of material, or when a different material starts to be removed, the spectral emissions at the point in time will change. Unfortunately, current techniques still suffer in accuracy, which is challenged even further with the ever shrinking feature sizes. In regard to current optical end-pointing, the use of changes in optical conditions is reliant on spectral conditions of one specific point in time.

It is in this context that embodiments arise.

SUMMARY

Methods and systems for examining time-series of spectra information extracted during processing of etch processing operations in order control etch endpoint operations. The methods and systems utilize training processes to generate three dimensional intensity surface profiles, referred to herein as carpets. A carpet refers to a model constructed by multiple sampled frames of intensity spectra information, such that time information of not only a current frame, but of one or more previous frames, are sampled. As a result, the carpet defines a model of a series of time (t) samples, and each time sample has its associated intensity spectra information (I (k), e.g., wavelength). The carpet therefore provides not only spectra information at one specific point in time, but also a history of changes in spectra information of a given wafer throughout its process.

In a training phase, multiple wafers are processed (e.g., etched), and for each wafer, a carpet is produced. For each carpet, the last frame sampled can be associated with an actual measured etch depth typically from a metrology system. Each carpet is descriptively defined mathematically by polynomials with coefficient values. Polynomial fitting for the training carpets are then processed to define a virtual carpet with floating coefficients, which is descriptive of all of the carpets produced during training. Using polynomial coefficients of the virtual carpet, the virtual frame numbers of the last frame of each wafer were obtained on virtual carpet. The correlation of these frame numbers against the measured etch depth were further optimized to obtain good accuracy.

At the end of the training, optimized polynomial coefficients are downloaded as recipe parameters for run-time execution. During real-time processing of wafers, the polynomial coefficients of the virtual carpet can be utilized by a controller of the etching system, in order to check endpoint. The controller, in one embodiment, is generating a carpet from the real-time processing. As the frames of the carpet are being generated, a group of consecutive frames (e.g., carpet patch), can be fitted to the virtual carpet in order to identify a current virtual frame number. The virtual frame number is pre-correlated to a predicted metric. In one embodiment, floating parameters, in addition to the virtual frame number, are used to map to a predicted value for a metric. The predicted value for the metric, when it substantially matches to a desired metric, is indicative of reaching etch endpoint.

Using this process, it is possible to operate end pointing, such that when the predicted etch point is reached, the etch process can end. Additional details regarding the processing for generating training carpets, generating virtual carpets, and real-time use of a virtual carpet will be described in more detail below with reference to the figures.

In one embodiment, a method for using a time-series of spectra to identify endpoint of an etch process is disclosed. The method includes accessing a virtual carpet that is formed from a time-series of spectra for the etch process collected during a training operation. And, running a fabrication etch process on a fabrication wafer, such that while the fabrication etch process is performed portions of a carpet defined from a time-series of spectra is generated for the fabrication etch process. Then, comparing the portions of the carpet of the fabrication etch process to the virtual carpet, end pointing is processed for the fabrication etch process when said comparing indicates that a desired etch depth has been reached for the fabrication wafer. In one example, said portions of the carpet include a current frame of captured spectra and at least one previous frame of captured spectra. The portions of the carpet of the fabrication etch process are fitted to the virtual carpet to identify a virtual frame number that is correlated to a predicted depth of etch for the etch process.

In some embodiments, the training operation includes performing the etch process on a plurality of wafers, and for each wafer capturing a time series of spectra at individually sampled frame times. The captured time series of spectra at the individually sampled frame times define a respective carpet, and each respective carpet is characterized by a polynomial with respective coefficients that describe a virtual carpet at different values.

In some embodiments, the coefficients of the respective polynomials of each carpet are produced during training are processed by a dimensionality reduction algorithm to produce the virtual carpet. In some embodiments, there are several ways of processing dimensionality reduction (e.g., stepwise, principle component analysis, etc.). The virtual carpet is defined by a standardized polynomial with respective coefficients as a superset of all coefficients of training carpets.

In some embodiments, the comparing of the portions of the carpet of the fabrication etch process to the virtual carpet includes fitting the portions of the carpet to the virtual carpet in order to identify a virtual frame number from the virtual carpet. The virtual frame number is mapped to a predicted etch depth, and said predicted etch depth when matched to the desired etch depth is indicative of etch endpoint.

In some embodiments, said training operation includes generating a plurality of carpets from sampled spectra data generated during etching of substrates, wherein each carpet is produced from substrate being etched. Then, measuring or receiving data regarding an etch depth for each of the etched substrates. The process further includes generating the virtual carpet from each of the plurality of carpets. The virtual carpet is defined by a polynomial with coefficients produced by fitting a plurality of polynomials with respective coefficients of each of the plurality of carpets. In one embodiment, some of the polynomial coefficients of the virtual carpet might be floating and others are fixed or coupled to the floating parameters so that all the polynomials of the respective coefficients of each of the plurality of carpets are a subset of those of virtual carpet. In one embodiment, said floating parameters, in addition to the virtual frame number, are used to map to a predicted value for etch depth, and said predicted value for etch depth when substantially matched to a desired etch depth is indicative of etch endpoint.

In some embodiments, the time-series of spectra is intensity spectral data associated with broadband in-situ reflectometry, or is intensity spectral data associated with Optical Emission Spectroscopy (OES), or is ellipsometric spectral data associated with broadband in-situ ellipsometry, wherein said spectral data is collected from a chamber used for etching while a feature is being etch on a wafer.

In another embodiment, a method for generating training data from a time-series of spectra generated during an etching process in a chamber is provided. The method includes etching a plurality of substrates in one or more chambers, wherein while the etching is processed, capturing a plurality of samples of frames of spectra. Each captured frame of spectra identifies an intensity of the spectra as a function of wavelength. Then, a metric, e.g., etch depth, is associated with each substrate after said etching is complete, by associating the measured metric to the last frame of spectra of the corresponding substrate. The method further includes generating a plurality of carpets for each of the substrates etched. Each of the carpets is defined by the plurality of frames of spectra and a polynomial with corresponding coefficients define characteristics of said each of the carpets. The method generates a virtual carpet by processing the plurality of carpets using a polynomial fitting algorithm, and the virtual carpet is a superset of the plurality of carpets, such that every one of the plurality of the carpets can be projected onto the virtual carpet to determine a virtual frame number. By way of example, due to the flexibility in the dimensionality of virtual carpet, the correlation between projected virtual frame number and predicted value of the metric from metrology can be optimized by one of floating, fixing, and/or coupling the hyper parameters of the virtual carpet. The method includes correlating the virtual frame numbers of the virtual carpet to a predicted value of the metric. In one embodiment, the method further includes tracking r-square or adjusted r-square.

In one embodiment, the virtual carpet is accessed by a controller during real-time processing of a substrate in order to determine when a current predicted value of the metric obtained from the virtual carpet corresponds to a predefined value that is indicative of endpoint of the etching process in the real-time processing.

In some embodiments, the metric associated with the etching is one of an etch depth, a critical dimension value, wafer bow, or a combination of two or more thereof.

In some embodiments, the controller is configured to connect to a database or a recipe file, to access the virtual carpet produced during said training for said real-time processing of the substrate.

In some embodiments, during said real-time processing the controller is configured to be generating a carpet for the real-time processing and as the carpet is being generated, at least a portion or a patch of the carpet is used to compare to said virtual carpet.

In some embodiments, said comparing includes performing a polynomial fitting of said portion or said patch of the carpet against hyper parameters of the virtual carpet, to enable correspondence to the virtual carpet and said carpet being produced to determine the virtual frame number, such that etch depth can be determined using recipe parameters determined during training. The virtual frame number is thus efficiently determined during said real-time processing.

In some embodiments, said portion of the carpet includes a current frame of captured spectra and at least one previous frame of captured spectra, wherein using said at least one previous frame of captured spectra during said comparing to said virtual carpet enables accurate identification of a current state of said real-time processing of said substrate.

In some embodiments, the portion of the carpet is fitted to the virtual carpet to identify a virtual frame number that is correlated to a predicted depth of etch for the etching process.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 1 illustrates a system that includes a chamber used for processing a wafer, in accordance with the one example.

FIG. 2 illustrates an example of a carpet, which is a three-dimensional representation of the surface generated by the time-series captures of frames, where each frame represents an instance in time that reports intensity as a function of wavelength.

FIG. 3 illustrates an example cross-section of a feature being etched, to a desired depth, in accordance with one embodiment.

FIG. 6B illustrates example polynomial coefficients of training carpets, e.g., carpets produced during training, and in this example an average is used to define a virtual carpet.

DETAILED DESCRIPTION

Figure 4:
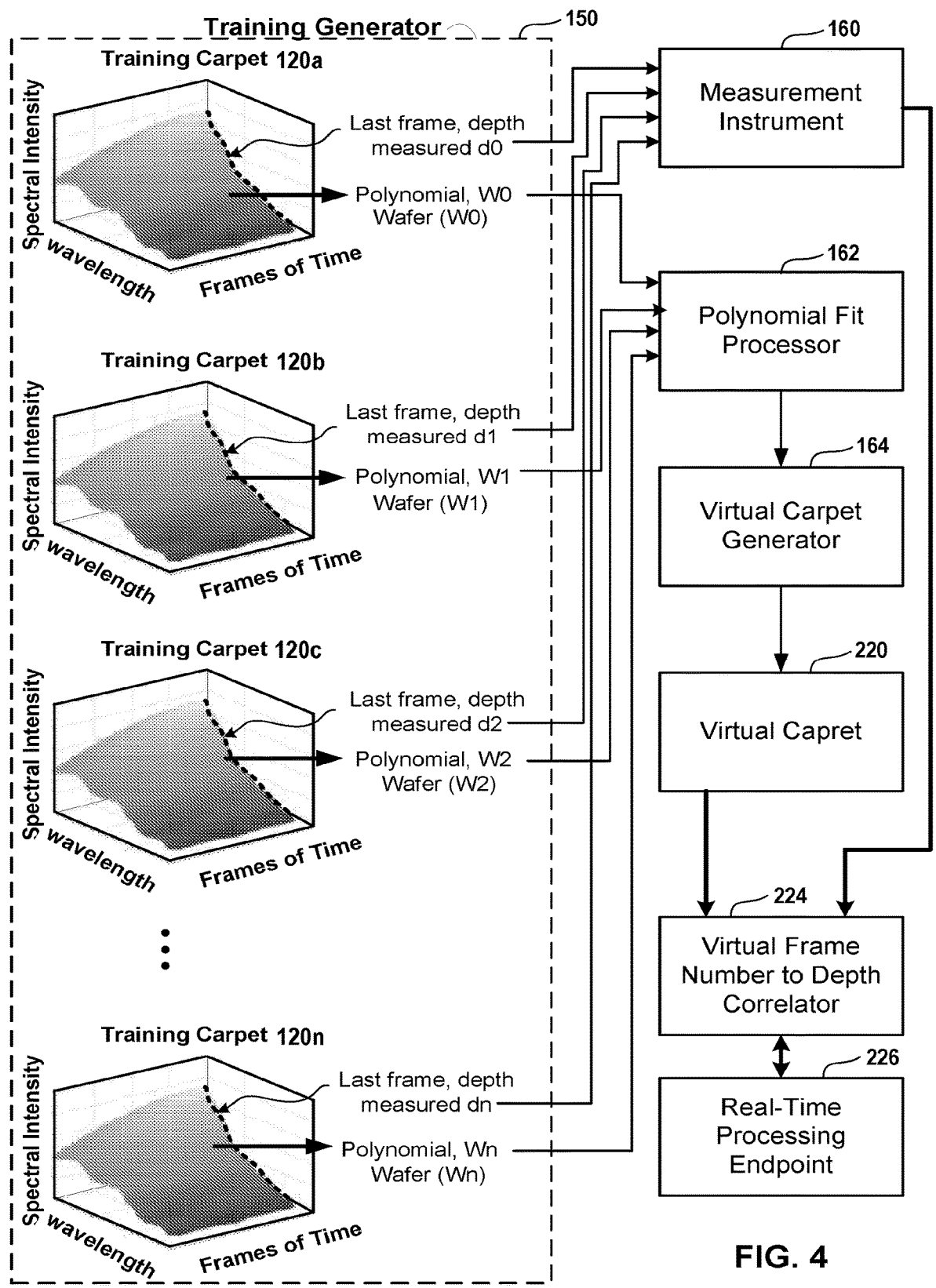
FIG. 4 illustrates more detail regarding the use of a training generator, which includes generating carpets for each of the training wafers, in accordance with one embodiment.

Methods and systems for examining time-series of spectra information extracted during processing of etch processing operations in order control etch endpoint operations. The methods and systems utilize training processes to generate three dimensional surface profiles, referred to herein as carpets. A carpet refers to a model constructed by multiple sampled frames of spectra information, such that time information of not only a current frame, but of one or more previous frames, are sampled. As a result, the carpet defines a model of a series of time (t) samples, and each time sample has its associated spectra information ($\lambda$, e.g., wavelength). The carpet therefore provides not only spectra information at one specific point in time, but also a history of changes in spectra information over one or more prior samples of spectra information. In one embodiment, an algorithm is defined wherein carpets are generated during training to produce a virtual carpet. The carpets and virtual carpet are in one embodiment, an extraction of broadband in-situ reflectometry spectra responses via polynomial regression in both time and spectral dimensions. A carpet is essentially a model of multiple time slices/frames, in which intensity as a function of wavelength is captured for each frame. Thus, for each time sample, a frame is captured, which also enables use of one or more prior frames that were captured, as the carpet is produced. By using the algorithms/methods described herein, the use of carpet processing during real-time processing has an additional benefit of decoupling spectra changes due to wafer level variations from the time evolution of spectra due to etching.

In one embodiment, machine learning may be implemented to use the time-series of spectra to extract critical conditions of the wafer. In one embodiment, a training phase is used, wherein a number of wafers are etch using a target process recipe. The training phase can be implemented using different process chambers, which implement the target process recipe. Wafer level variations can be introduced in many ways, such as due to variations in previous steps of wafer processing, variations in chambers, variations in wafer properties, variations in wafer lots, variations in possible wafer tilt or rotation, and other wafer level variations. The result is that etch processes will vary, even when the same target recipe is used on the same machine. However, in accordance with one embodiment, during the processing of each wafer during the training, spectral data are sampled over a period of time of the etch process for a plurality of wafers. The sampling therefore produces a plurality of sampled frames of spectra information, defined as intensity as a function of k.

The time series of frames therefore define data of a three-dimensional (3D) surface representing intensity, referred to herein as a carpet. The carpet, in one embodiment, therefore provides historical information of changes in the spectral intensity, not just a single intensity spectra graph. For each wafer used for training, a measurement is made of the depth of etch. Measurement may be conducted with any number of metrology tools. One example way is to use optical CD (OCD) metrology. OCD metrology can be used to determine various metrics, including etch depth, feature characteristics, pre-etch CD, feature or etch profiles, etc. In one embodiment, the measured depth of etch is then correlated to the last frame of the carpet, which includes spectral intensity at the state where depth of etch was measured. But, because the carpet also holds information regarding previous frames, it is useful to understand what the spectral conditions were that lead up to the final frame. In one embodiment, each carpet produced is mathematically obtained by fitting the experimental spectra with a polynomial or order m*n, having unique coefficients (C0, ... Cmn), where m denotes the order in time dimension and n the order in wavelength dimension. Mathematically the fit algorithm is a regression method to minimize the figure of merit, which is defined as the difference of polynomial estimate and experimental spectra.

In one embodiment, an operation is introduced to reduce dimensionality of the polynomial coefficients. This dimensionality reduction can be implemented by either stepwise regression, multi-carpet coupled regression, or principle component analysis. The objective of dimensionality reduction is to use the least dimensions to account for the variations among carpets and to correlate successfully with the etch depth measurement, in terms of floating parameters in these hyper dimensions and virtual frame number representing etch time impact.

In one embodiment, regression was processed by executing a multi-carpet coupled regression. The algorithm is configured to take as input the polynomials of each of the carpets generated during the training, and then fit them into a polynomial with reduced dimension of parameters (C0, . . . Cp), that define a virtual carpet, by using a combined mean square error (MSE) inclusive of all carpets. By way of example, the MSE is typically defined as:

$$MSE = \frac{1}{n}\sum_{i=1}^{n}(\hat{Y}_i - Y_i)^2$$

In one embodiment, some polynomial coefficients are coupled across the carpets, defined by a linear relationship, to represent carpet-to-carpet constancy while leaving the rest floating. The choice regarding which parameters to couple and which to float is determined by the impact on the mean square error between the carpets and experimental spectra.

In another embodiment, dimensionality reduction was processed by stepwise parameter reduction. Correlation of reduced parameter space to the etch depth measurement, in terms of R square and adjusted R square, is evaluated as parameter space is adjusted to find good correlation with least parameters. Not all parameters are needed to correlate against etch depth measurement.

In still another example implementation, principle component analysis was used to find the correlation of scores of principle components, virtual frame number, and measured etch depth. Number of principle components can be increased to reach better correlation. Once satisfactory correlation is reached to explain measured etch depth with reduced hyper dimensions from above and virtual frame number, training is complete.

In the case where the difference of polynomials of training carpets are small and virtual carpet frame number itself is enough to account for the measurement of etch depth with desired accuracy, the polynomials of virtual carpet may be obtained by an average of polynomial fit coefficients.

In another embodiment, the spectral response of a reference wafer may be used to compare the other wafers. Additionally, there are several other ways of linking the polynomial coefficients and virtual frame number, to etch depth. One such method is a partial least square method, and in another embodiment neural network processing is employed to establish a relationship of parameters to measured etch depth.

Once the training process is complete, the virtual carpet can be used during real-time processing of production wafers to determine etch endpoint. In one embodiment, the virtual carpet information is used, in conjunction with real-time spectra, to measure effective etch depth as a function of spectral history. More information regarding the use of the virtual carpet will be described with reference to the figures.

In some embodiments, instead of measuring etch depth, the virtual carpet can be linked to critical dimension (CD) measurements, line width, pitch, spacing, bow detection metrics, and other measurable metrics. That is, for each wafer processed during the training, the resulting carpet can be correlated to a measured metric, which need not be etch depth. By way of example, wafer bow is described in Lam Research Corporation U.S. Pat. No. 9,123,582, which is incorporated herein by reference.

In one embodiment, during real-time processing (i.e., run-time), the virtual carpet can be used to predict broadband in-situ reflectometry spectra vs. time and intended target etch depth. This process therefore enables accurate predication of etch rates at a wafer level, and time to stop the etching. Broadband in-situ reflectometry or interferometer measures of reflectance of the wafer surface during etching (or deposition), by focusing a light beam on a spot onto the wafer and measuring the intensity of the reflected light in a plurality of wavelengths. One example of broadband in-situ reflectometry is flash lamp/continuous wave reflectometry (e.g., which is sometimes referred to as Lam Spectral Reflectometer (LSR)). For more related information on in-situ interferometer systems, reference may be made to Lam Research Corporation U.S. Pat. Nos. 6,400,458, and 6,160,621, which are incorporated herein by reference.

In another implementation, a dynamic time wrapping (DTW) algorithm can be used to calculate a matching of spectra against a reference spectra, which can then be directly used to calculate etch rate and ideal etch stop.

There are several advantages of using time series of spectra. One advantage is that it ensures model dependence of causal relations of spectra. This acts to constrain the modeling parameters and also provide added accuracy. By way of example, the same spectra of two different time series could tell different conditions of the wafer, as bias could come from incoming variations. An additional advantage is that the spectral and temporal covariances are explicitly modeled in the virtual carpet to preserve information content. Thus, there is no loss of experimental information. Still further, an advantage of scalability is ensured to handle large amount of experimental spectra, as each carpet is fit individually.

Training of the algorithm for active control is faster than many other physics based models requiring extensive physical modeling. Additionally, run time execution speeds are also faster than physically based models for such complex reflectance from mixed arrays.

It should be understood that the methods described herein are not limited to intensity spectra. The methods can be applied to any set of signals in time appropriately scaled, where within each time frame the correlated signal can be represented in 'x' with a particular signature of correlation in the sense of principle components along x as a 'spectra' in time, and the same dimensionality reduction and training strategies can be adopted. For example, time traces from multiple sensors related to the electrostatic chuck (ESC) can be analyzed in similar fashion to predict the CD (critical dimension) or CD uniformity in analogy to wavelength time traces from wafer to predict local depth. The covariance of these non-spectral signals can be handled by principle component analysis to extract essential information for given time frame, therefore enabling endpoint control at higher accuracy.

It will be apparent, that the present embodiments may be practiced without some or all of these specific details, for example the etch rate. In other instances, well-known process operations have not been described in detail in order not to unnecessarily obscure the present embodiments.

Figure 5:
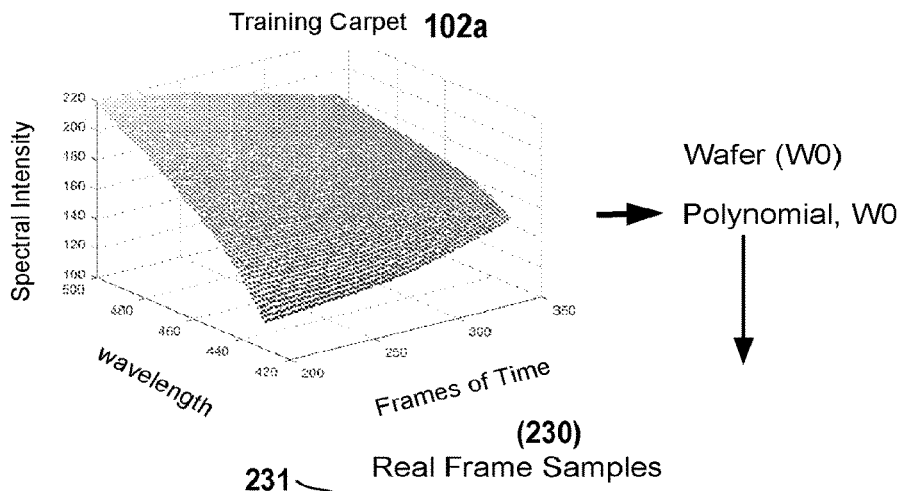
FIG. 5 illustrates an example of a carpet, producing its corresponding polynomial when a wafer (W0) is etched during training, in accordance with one embodiment.

FIG. 1 illustrates a system 100 that includes a chamber 102 used for processing a wafer 106, in accordance with the one example. In this example, plasma 108 is used for processing the wafer 106. The plasma 108 can be used for etching features into the wafer 106. Although not shown, the chamber 102 will be connected to a power supply, which is configured to deliver RF power to an electrode of the chamber 102 in order to produce the plasma 108. Controller 110 is configured to interface with the chamber 102, and the RF power supply, in order to control the etching process. In some embodiments, the chamber 102 may be a capacitively coupled plasma (CCP) chamber, or an inductively coupled plasma (ICP) chamber. As further example system, reference may be made to U.S. Pat. No. 6,979,578, issued to Lam Research Corporation, which is incorporated by reference. In the '578 patent, examples of optical fibers used in in-situ data collection are shown in FIG. 5.

In either case, the chamber 102 and its processing, is interfaced with a controller 110, which can provide the settings necessary for processing a recipe for etching by the system 100. An in-situ monitoring device 104, may be integrated with the chamber 102 and couple to controller 110. In-situ monitoring device 104, may be configured to detect optical characteristics or spectra data of spectral emissions associated with the processing of the wafer 106. In one embodiment, the in-situ monitoring device 104 is configured to collect and/or sample spectral data associated with reflectometry or interferometry optical signals, or spectral data associated with Optical Emission Spectroscopy (OES).

In one specific example, the in-situ monitoring device 104 is configured to generate broadband light that is projected onto the surface of the wafer 106, while a detector collects the spectral data associated with the reflected light from the surface of the substrate. Although the following discussion primarily focuses on monitoring reflectometry or interferometry optical signals, the system can be operated using OES, or other inspection techniques.

In one embodiment, the controller 110 is configured to execute processing operations that utilize the spectral data collected by the in-situ monitoring device 104, in order to process carpet information from the emissions of the wafer 106. As mentioned above, a carpet is defined as a collection of frames representing instances of captured spectral data in a time series. That is, the spectral data is collected by the in-situ monitoring device 104 at predefined intervals, such as at every predefined number of milliseconds, seconds, or some custom time setting.

FIG. 2 illustrates an example of a carpet 120, which is a three-dimensional abstraction of the surface generated by the time-series captures of frames, where each frame represents an instance in time that categorizes intensity as a function of wavelength. As shown, frame 0 is the first frame captured for the carpet 120, and each subsequent frame up to frame n, represents the carpet for an etch operation that is illustrated in FIG. 3. Each of the frames 1-n, is captured at a specific times, t0-tn. Each frame therefore has its own respective spectra that is descriptive of the intensity in terms of wavelengths. As each frame is captured, the carpet 120 is constructed, therefore exposing information regarding the changes in the intensity in terms of wavelength as time progresses.

Thus, information is being gathered not only of a single timeframe where intensity as a function of wavelength, but also the continual changes of the intensity as a function of wavelength for a plurality of times. Thus, at any one point in time, it is possible to ascertain the changes that occurred that led up to the current state of time. This information will expose what intensity changes occur as the substrate material 130 is being etched to define etch feature 132. The example shown in FIG. 3 shows a single etch feature, but it should be understood that etching operations are typically carried out substantially simultaneously for any number of features which could be smaller than the wavelength of light, and might correspond to a single field or many fields of lithography exposure, distributed throughout a semiconductor wafer. In the embodiment where a single reflectometer sensor is used, only the spectra time series under the spot of illumination were collected but used to control the end-point of the entire wafer. When feature critical dimension and depth changes as etch progresses, diffraction of incoming beam would generate a change of intensity in the far field as a function of wavelength, and result in intensity change at the spectrometer.

Thus, the illustration of FIG. 3 is only provided to show that as the etch progresses, frames of spectral intensity as a function of wavelength will continue to be captured, thus building and defining the carpet 120. In one embodiment, for a specific wafer processing operation, such as an etch operation, the feature being etched will reach a specific depth, which is shown in FIG. 3 as a measured depth (dm). At that point, the etch operation is complete, and the carpet 120 of FIG. 2 is complete. This results in the last frame (e.g. frame n), being the frame that corresponds to a measured depth dm, at time tn.

The illustration of carpet 120 of FIG. 2, and the etch operation in FIG. 3, were shown to illustrate the capture of multiple frames of spectral data. It should be understood that many more frames will be captured, based on the desired sampling frequency, which can provide a more dense carpet 120 with rich information associated with changes in feature CD, depth, or profile information at the wafer level. In one embodiment, the carpet 120 is said to change as a function of time, which is uncovered by the multiple frames captured as a function of wavelength. The carpet 120, in one embodiment, can be characterized using a mathematical polynomial, with its associated coefficients, for a range of wavelengths. The coefficients of the polynomial will therefore define a surface in time and wavelength, which can be accessed as will be described below.

As described above, one embodiment described here in utilizes a training process that requires that multiple wafers be processed for a specific etch recipe and etch process. In some embodiments, the same chamber 102 will be used for various wafers. In other embodiments, different chambers can be used for each of the wafers. Each of the wafers processed during the training operation will produce a respective carpet 120. Each of the carpets will define the characteristics seen by the in-situ monitoring device 104, in terms of the spectral data captured at each of the frames, based on the sampling frequency. Once a plurality of carpets are defined, these carpets can be fit using a polynomial fit algorithm to generate a carpet with floated, fixed, and/or coupled coefficient parameters, which is referred to herein as a virtual carpet.

FIG. 4 illustrates more detail regarding the use of a training generator 150, which includes generating carpets for each of the training wafers, in accordance with one embodiment. As shown, the training generator 150 includes the generation of carpets 120a-120n, where each carpet is associated with a respective polynomial, and each carpet has a last frame that is to be correlated to a measured depth of etch. Because there will be variations between process conditions, chamber configurations, and other factors, it is possible that the etch termination when generating each of the carpets will be different. This effect would be modeled by the loading of polynomial coefficients via stepwise regression, multi-carpet coupled regression, or principle component analysis, where the parametric difference of different carpets would reveal its impact on end-point estimate and subsequently be determined via linear regression against measured etch depth.

In some embodiments, the various wafers may intentionally be etched to different depths, so as to generate various size carpets 120. In either case, each of the carpets 120 are captured, in terms of their polynomial and associated coefficients. As mentioned above, the various coefficients of the polynomial will be descriptive of the three-dimensional contour shape of the carpet, which was defined by the multiple frames captured over time for that etch operation. In this example, a polynomial fit processor 162 is configured to receive the polynomials from each of the carpets 120a-120n. Additionally, the measured depths for each of the wafers associated with each of the carpets 120a-120n, will also be captured by a measurement instrument 160. The measurement instrument 160 can take on various forms, and broadly speaking our semiconductor metrology tools that are capable of measuring specific parameters or metrics of a wafer, features, depths, and generally characteristics. Examples include cross-sectional SEM, TEM and scatterometry.

The polynomial fit processor 162 is configured to communicate with a virtual carpet generator 164. The virtual carpet generator 164 is a dimensionality reduction and linear regression process by which a virtual carpet 120 is generated. The virtual carpet 120 is configured to have a predefined size, in terms of frames of spectral data, which is spectral intensity as a function of wavelength. The polynomial fit processor 162, as mentioned above, is configured to receive the polynomials of the various carpets 120a-120n, and thus fit them in accordance with the constraints defined by the virtual carpet generator 164. In one embodiment, the virtual carpet generator 164 is configured to generate a virtual carpet 220, which can be generated by various techniques described above.

The virtual carpet 220, is therefore generated, and the virtual carpet 220 as well as the measurement instrument 160 outputs are correlated in 224 to associate the virtual frame numbers of the virtual carpet to a specific depth or metric that was measured by measurement instrument 160. Thus, during real-time processing and end point operations 226, the controller of a chamber can access the virtual carpet 220 and/or the virtual frame number to depth correlator 224, to identify when and etch process has reached end point. End point is reached when the etching process has reached the intended depth for the specific features being etched, and by use of the virtual carpet, end point can be reached by associating a portion of a currently processed carpet (i.e., for a current fabrication operation), to the virtual carpet 220.

By way of example, real-time processing of real fabrication wafers can utilize this algorithm where the controller is generating a carpet for the current etch operation. During processing, frames are being produced for a carpet, which are added to previous frames already produced. In one embodiment, a current frame and one or more previous frames (i.e., a patch) can be used from the currently generated carpet during real-time processing of an etch, to perform a fitting to the virtual carpet. By fitting to the virtual carpet in a dynamic and real-time manner, it is possible to identify a predicted depth of etch in real time. As noted above, the virtual carpet will hold information regarding virtual frame numbers, which are pre-correlated to etch depths.

As will be described below, the various etch depths can be approximated from the various wafers processed during the training session. And, that previous training session produced the virtual carpet, so therefore, information regarding the predicted depth for currently captured frames of spectral data (or a patch of frames), will produce a tightly correlated estimate or prediction of the actual etch depth. Thus, by continuing to process the carpet during real-time processing, a point will arrive where the frames being fitted and mapped to the virtual carpet will be indicative of the desired depth, for a specific etch operation. At that point, the controller of the chamber can indicate to the system that end point has been reached, and the etch operation will be stopped.

FIG. 5 illustrates an example of a carpet 102a, producing its corresponding polynomial when a wafer (W0) is etched during training, in accordance with one embodiment. In this example, it is shown that carpet 120a was produced as a result to real frame samples 230, which includes frame numbers 231 and time 232. At the completion of the etch operation process to generate the carpet 120a, a final frame from the various samples frames is reached. In this example, the final frame is frame 467. Frame 467 is only shown as an example number, and the frames captured will depend on the sampling frequency, and duration of an etch operation.

Continuing with the example, frame 467 will be associated with a measured etch depth or some other parameter or metric that is being inspected or measured by a measurement device or system. As mentioned above, it is also possible to measure or correlate the frames of spectral intensity as a function of wavelength for different metrics. Such metrics, may include critical dimension inspections, bow characteristics in wafers, and other metrics that are commonly measured or are measurable.

Figure 6A:
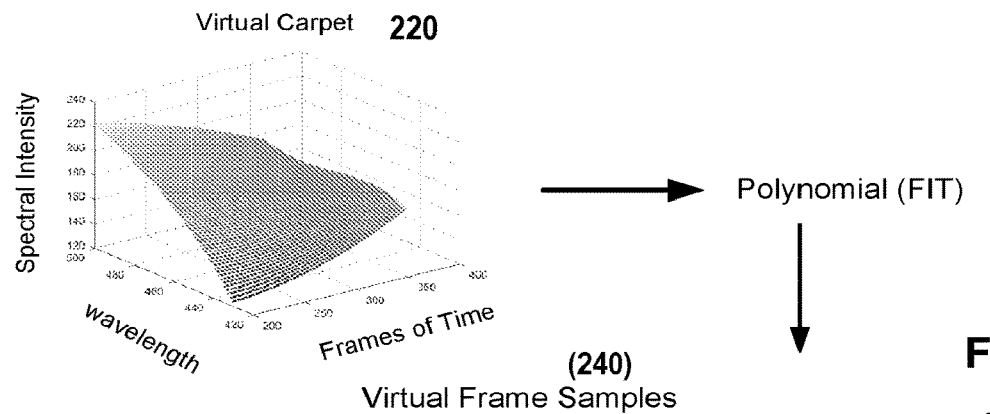
FIG. 6A illustrates an example of a virtual carpet, having its corresponding polynomial, which is derived from all of the polynomials generated during the training operation.

FIG. 6A illustrates an example of a virtual carpet 220, having its corresponding polynomial, which is derived from all of the polynomials generated during the training operation. As shown, for this virtual carpet, virtual frame samples 240 are also identifiable, where virtual frame numbers are associated with different times, which are derived from multiple real frame samples 230, which correspond to all of the polynomials generated from the various carpets produced from different wafers during training. The virtual frame samples 240 will also include virtual frame numbers 241 and the corresponding time 242.

In this example, because the virtual frame numbers have been standardized, the virtual frame numbers will extend from virtual frame number 0 to virtual frame number 300. It is understood that the virtual frame numbers of all of the various training carpets will have different numbers of frames, and the various frames and their associated polynomial coefficients are derived so that they are standardized to the set of virtual frame numbers defined for the virtual carpet 220. By generating the virtual carpet 220, it is possible to extract out the variations that occur from the various training carpets, and thus generate and eliminate abnormalities or false positives that may have occurred in each individual carpet. Further, by generating virtual carpet 220, is possible to use virtual carpet 220 for later reference by processes that are running production wafers, and such production wafers can utilize the virtual carpet 224 identifying end point.

Figure 7:
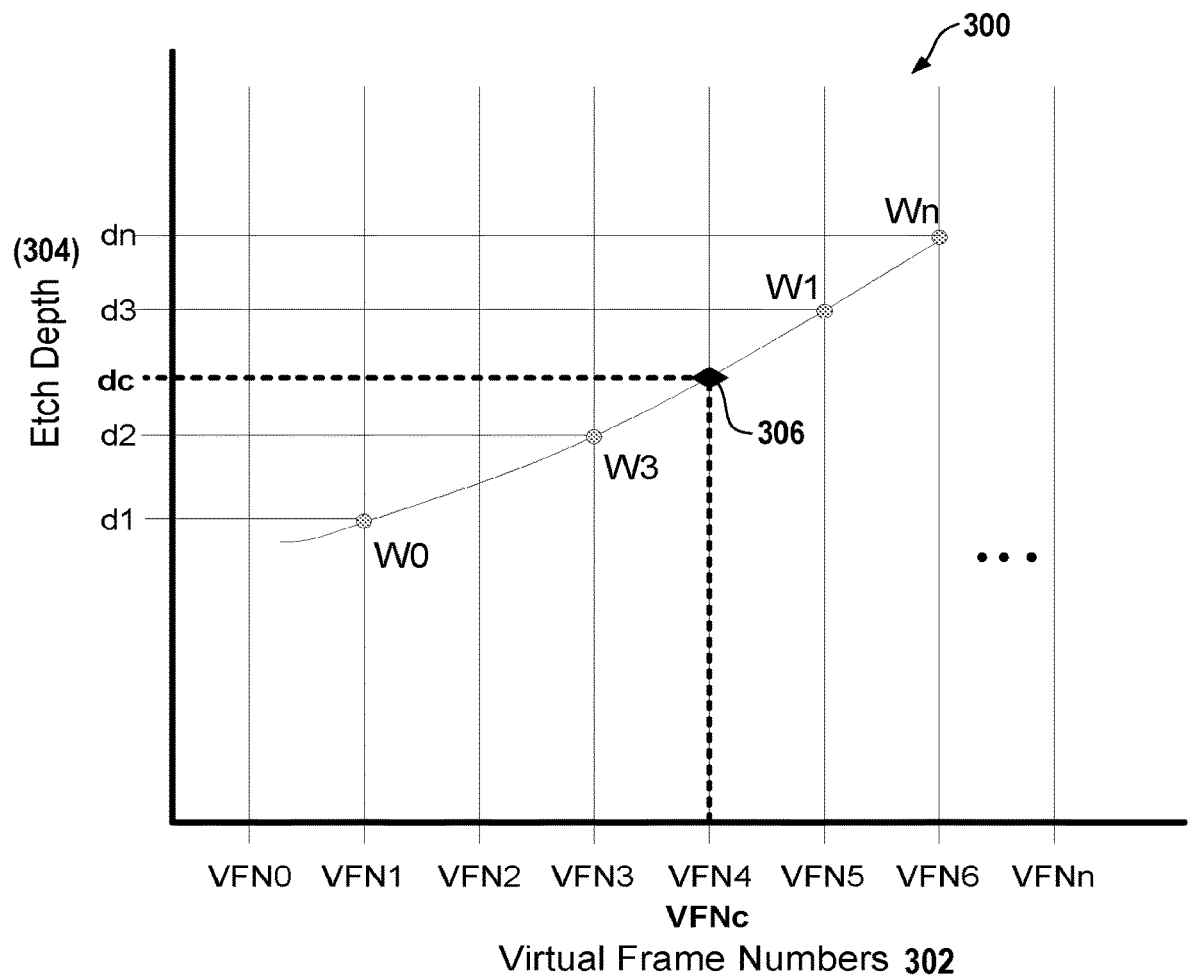
FIG. 7 illustrates an example of a mapping chart between the virtual frame numbers of the virtual carpet and measured depths for the etch operations performed during the training that produce the various carpets, in accordance with one embodiment.

For purposes of providing an example of polynomial coefficients associated with wafer runs during training (e.g., wafers 1-5), and a resulting virtual carpet (e.g., average), FIG. 6B below shows some example numbers. In this example, the average is used to define the virtual carpet, although other methods may be used. For example, instead of averaging, FIG. 7 illustrates an example of a mapping chart 300 between the virtual frame numbers of the virtual carpet 220 and measured depths 304 for the etch operations performed during the training that produce the various carpets, in accordance with one embodiment. During processing of a fabrication wafer, the controller can be generating its own carpet, defined by a plurality of frames having intensity as a function of wavelength. As the carpet is being generated, periodically two or more of the frames, or a patch of the carpet, can be captured and fitted to the virtual carpet 220. By fitting into the virtual carpet 220, it is possible to identify the virtual frame number 302 of the most current frame being processed by the chamber performing the etching on a wafer.

As shown in 310, the current frame number (VFNc) can be identified from the virtual frame numbers 302, and correlated to predict the current depth dc from the etch depth 304 of the mapping chart 300. As shown in the mapping chart 300, the various test wafers used during training can also be mapped to the chart, which will produce a substantially linear approximation. The linear approximation will show the depths that were measured for each of the test wafers, as they were associated to the last frame in the respective carpets 120. This illustrates that wafer 0 was etched to a depth d1, wafer 3 was etched to a depth d2, wafer 1 was etched to a depth d3, and wafer and was etched to a depth dn.

These steps can be shown to occur substantially along a substantial straight line, as the virtual frame numbers are a fitted representation of the frames collected from each of the carpets 120. Thus, it is expected that the standardization provided by the virtual carpet will produce this substantial linear response or representation. Consequently, during processing, the current virtual frame number VFNc, may be mapped to point 306 along the linear approximation, which can then be correlated to the predicted current depth dc, during the processing. The depth dc is further approximated to lie between depth d2 and d3, based on the linear approximation and the identified virtual frame number. The depth dc, in one embodiment, can be identified using interpolation. If the real-time processing required that a depth of d3 be reached, the system would continue to process the carpet for the current fabrication operations, and will continue to compare two or more frames or a patch of the currently being generated carpet of a wafer with the virtual carpet, upon fitting the current patch or frames to the virtual carpet.

Thus, the process can continue to check whether the current virtual frame number corresponds to the desired depth d3. Once the system processing the production wafer reaches to VFN5, for example, a depth d3 will be reached, and the controller will instruct the etch process to stop.

Figure 8A:
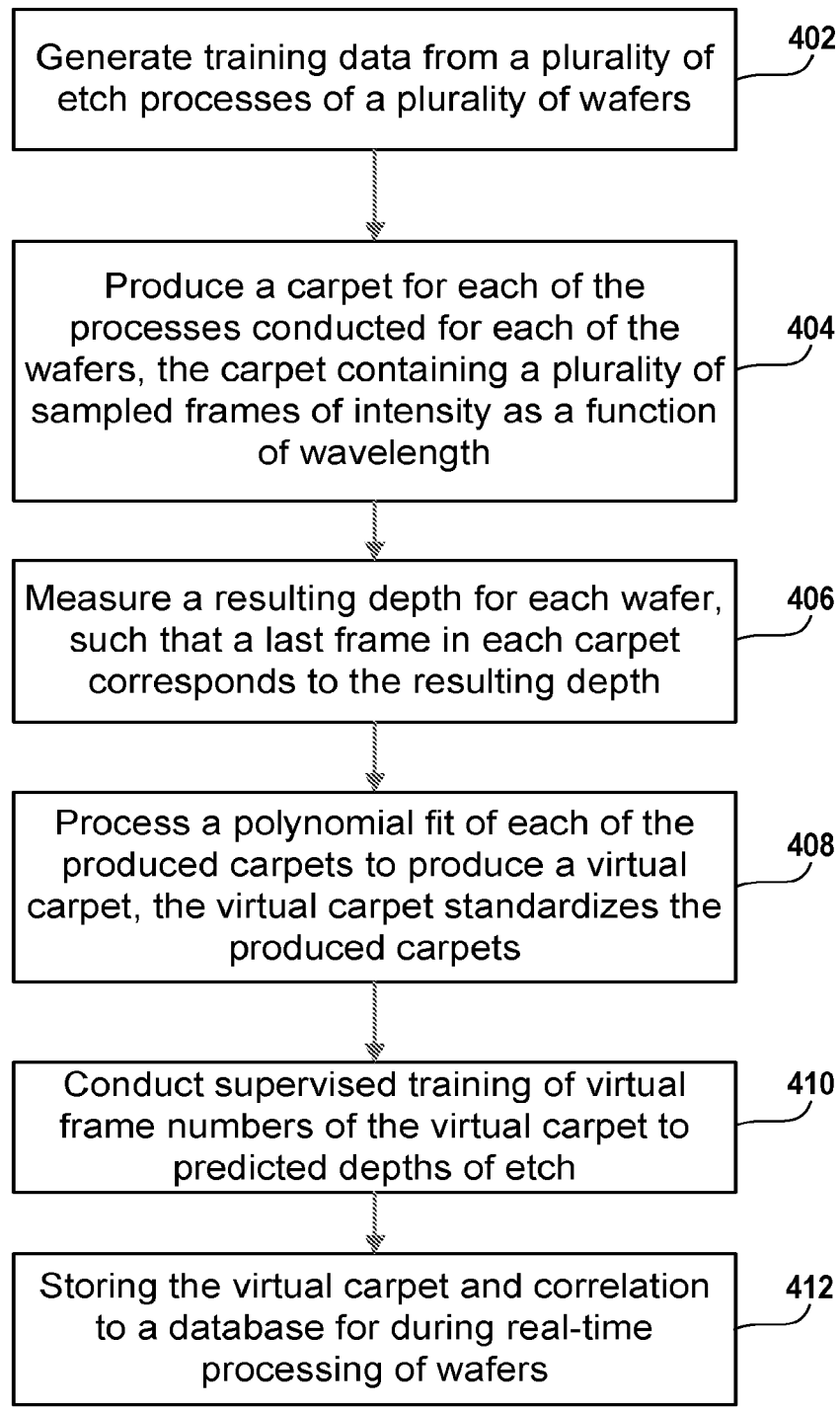
FIG. 8A illustrates an example process of generating training data from a plurality of wafers, to produce a plurality of carpets that are then fitted to a virtual carpet, in accordance with one embodiment.

FIG. 8A illustrates an example process of generating training data from a plurality of wafers, to produce a plurality of carpets that are then fitted to a virtual carpet, in accordance with one embodiment. In operation 402, training data it is generated from a plurality of etch processes of a plurality of wafers. As mentioned above, the same etch system or various etch systems configured similarly, can process a number of wafers, and during the processing, intensity as a function of wavelength can be captured. In operation 404, a carpet for each of the processes conducted for each of the wafers is produced.

The carpet will contain a plurality of sampled frames of intensity as a function of wavelength. When the process etching is complete for the training wafer, operation 406 will measure a resulting depth for each wafer, such that a last frame in each carpet will corresponds to the resulting depth that was measured. On one example, a metrology system may be used to conduct the measurements. In operation 408, a polynomial fit is processed for each of the produce carpets to produce a virtual carpet. Some of the polynomial coefficients of the virtual carpet might be floating and others are fixed or coupled to the floating parameters so that all the polynomials of the respective coefficients of each of the plurality of carpets are a subset of those of virtual carpet. The virtual carpet is therefore a super set of the plurality of carpets produced during processing of wafers during training. In operation 410, a correlation is generated between virtual frame numbers of the virtual carpet to predicted depths of etch. This includes conducting supervised training of virtual frame numbers of the virtual carpet to predict depths of etch or a metric.

By way of example, the correlation is shown in FIG. 7, by way of the mapping chart 300. In operation 412, the virtual carpet and the correlation is stored to a database for use during real-time processing of wafers.

Figure 8B:
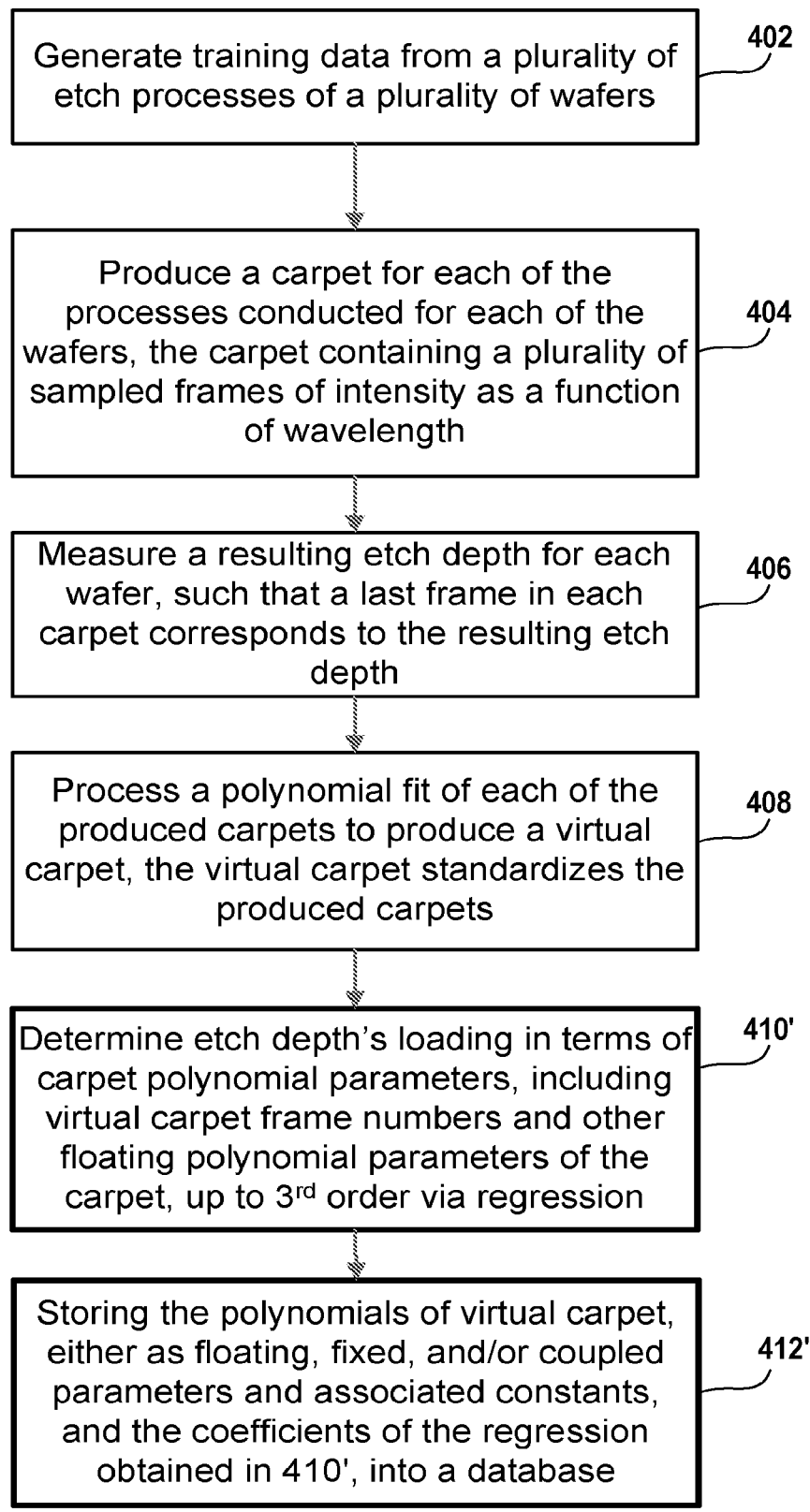
FIG. 8B illustrates another example process of generating training data from a plurality of wafers, to produce a plurality of carpets that are then fitted to a virtual carpet, and etch depth's loading in terms of carpet polynomial parameters, including virtual carpet numbers and other floating polynomial parameters of the carpet, up to 3rd order via regression, can be determined, in accordance with one embodiment.

FIG. 8B is another example of the process of FIG. 8A, with additional detail provide in regard to operations 410 and 412. In this example, operation 410' describes that etch depth's loading can be defined in terms of carpet polynomial parameters. Such parameters may include virtual carpet frame numbers and other floating polynomial parameters of the carpet, and in some cases up to 3rd order via regression. In operation 412', the polynomials of virtual carpet are stored. The polynomials can be stored in a database as either as floating, fixed, and/or coupled parameters and associated constants. In this example, the coefficients of the regression are obtained in 410'.

As used herein, real-time processing a wafers means that production wafers are being processed, and the endpoint mechanisms utilized implement the use of fitting produced carpet patches to a virtual carpet, that was generated during a prior training operation. In some embodiments, the controller of the chamber can process the correlation of the carpet being generated to the virtual carpet. In other implementations, a separate computer or even a network computer can access the virtual carpet and produce the results from the comparison, the fitting operations, and the resulting endpoint determinations.

In further embodiments, the process can be shared by one or more computers or one or more processes, in the form of real computers or virtualized computers. In some embodiments, the processing can be distributed among a plurality of virtual machines. In either manner, the processing of fabrication wafers can implement a virtual carpet, such that carpets being produced during fabrication can be compared to the virtual carpet in order to determine endpoint or verify a metric associated with the etching process. As mentioned above, measurements can be made of etch depths. However measurements can be made of any number of feature metrics, such as wafer characteristics, critical dimensions, wafer bow, and the like.

Figure 9:
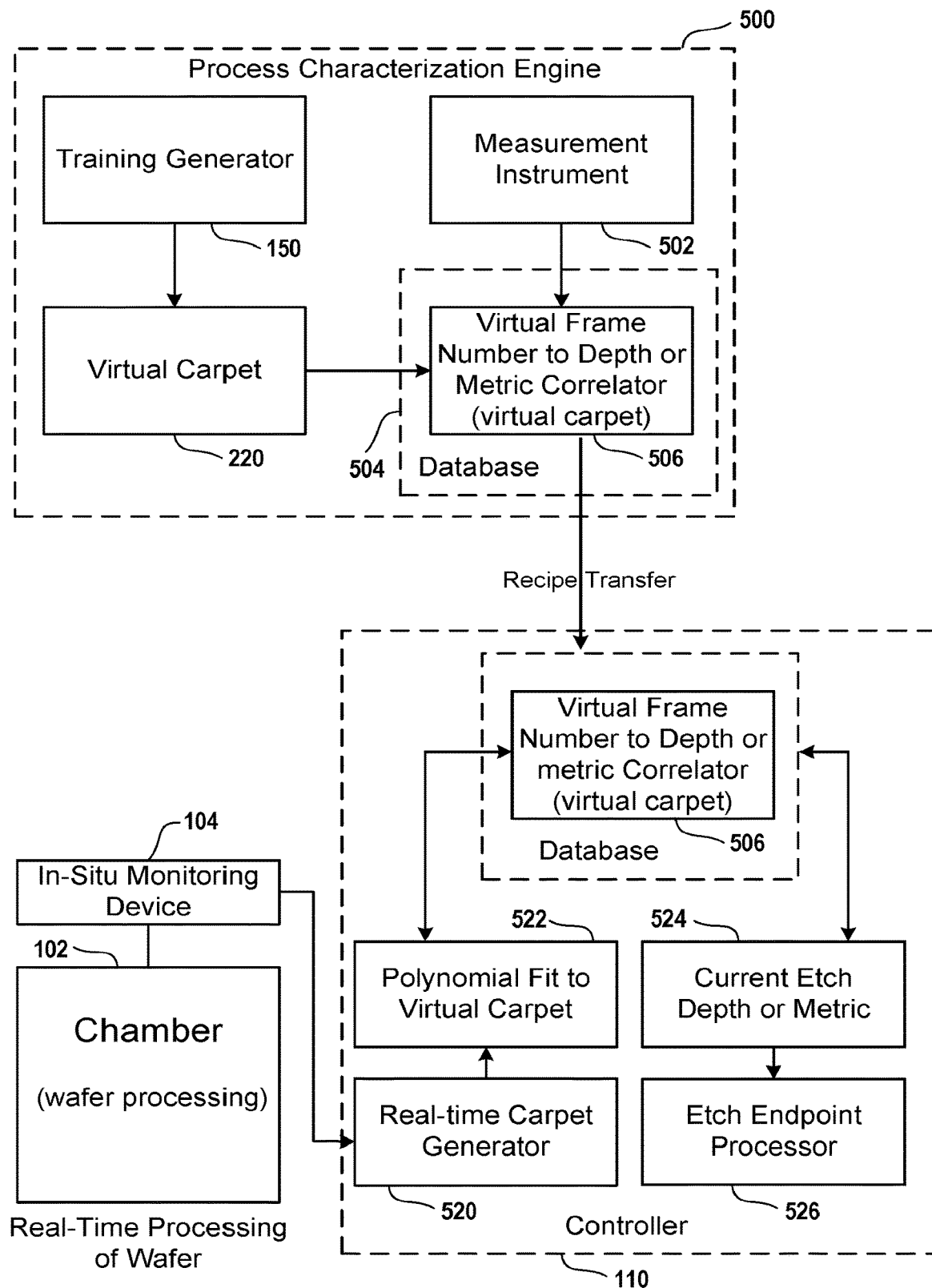
FIG. 9 illustrates an example of a system utilized for generating a virtual carpet, and the chamber and controller accessing virtual carpet data in order to determine etch endpoint, in accordance with one embodiment.

FIG. 9 illustrates an example of a system utilized for generating a virtual carpet 220, and the chamber and controller accessing virtual carpet data in order to determine etch endpoint or some other metric, in accordance with one embodiment. As shown, process characterization engine 500, is configured to define functional operations performed by various systems. Training generator 150, can include process operations and instructions that can communicate with one or more chambers, for running the training operations on one or more wafers.

Figure 11:
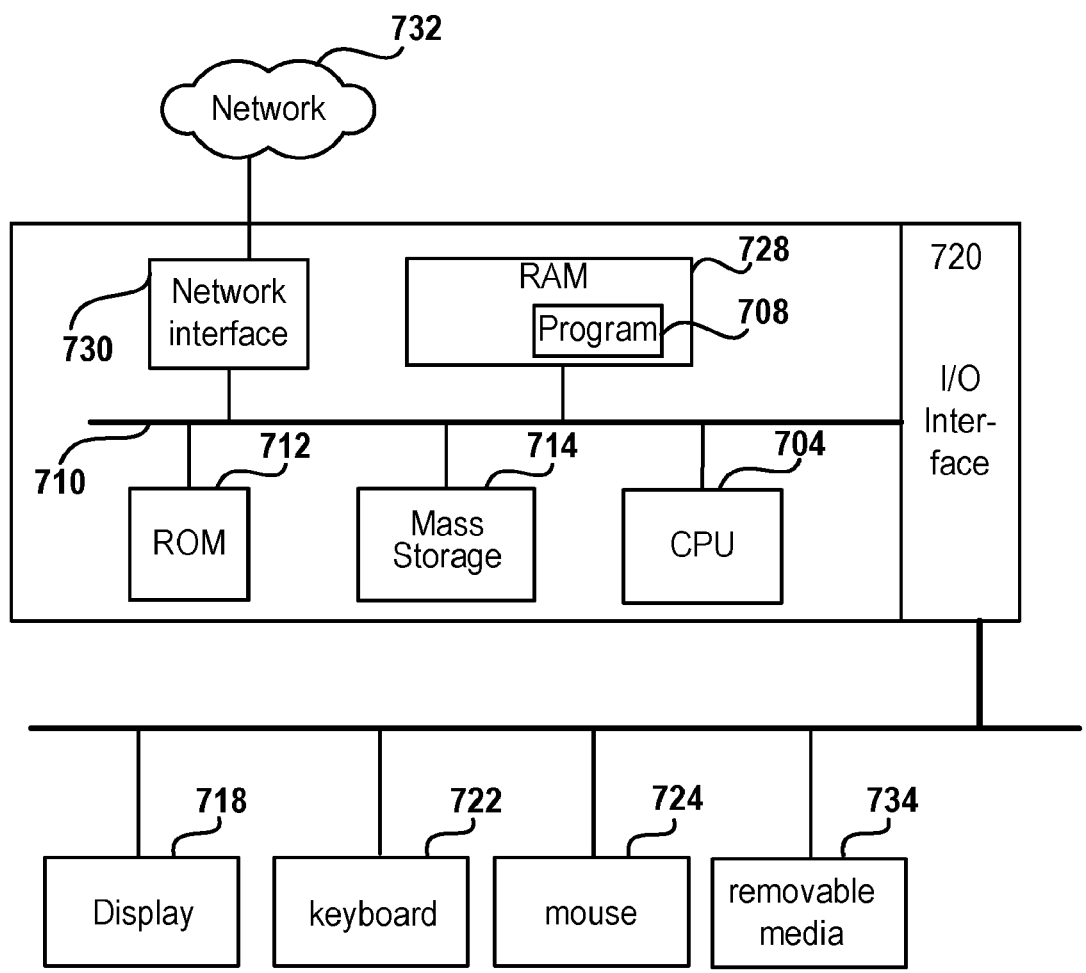
FIG. 11 is a simplified schematic diagram of a computer system for implementing embodiments.

The results of the training will produce respective carpets 120, which are then used to produce a virtual carpet 220. The measurement instrument 502 can be utilized to measure the resulting etch depths, feature parameters, or other metrics, which are associated to the last frame in the carpet 120 produced by each of the training system or systems. A virtual frame number to depth correlator 506 may be provided, where etch depth is the metric being measured. The correlator 506, in one embodiment, may be defined as code or instructions or data that can be stored in a database 504, which includes data of the virtual carpet 220. In another embodiment, the virtual frame number to depth or metric correlator 506 can be stored in a recipe file, hardcoded data, or such data can be retrieved from a server. Recipe transfer can be implemented, for example, via 734 and/or 714 as shown in FIG. 11. In either configuration, the virtual frame number to depth or metric correlator 506 is made accessible to real-time processing of wafers. During real-time processing, the controller 110 will obtain or download data from the database 504, i.e., virtual carpet data, for use.

As shown, chamber 102 will have its corresponding in-situ monitoring device 104. The controller 110 will be interfaced with the chamber 102 and the in-situ monitoring device 104. The controller 110 will be configured to generate a carpet in real-time, by real-time carpet generator 520. The real-time carpet generator 520 is essentially producing frames that represent intensity as a function of wavelength during each sample. Thus, even before an etch process is complete, the real-time carpet generate 520 will be busy generating more and more frames for each of the corresponding predefined sample times. In operation 522, a polynomial fit to the virtual carpet is performed.

To do this, the polynomial and associated coefficients of the polynomial for at least a portion of the carpet being generated by generator 520, will be fit to the virtual carpet 220 in order to identify a virtual frame number from the virtual frame number to depth or metric correlator 506. The result is that the controller 110 will receive or identify a current etch depth or metric 524. As shown in FIG. 7, this process may entail the identification of a virtual frame number that has been correlated to an etch depth or metric, from the look up to the virtual carpet by the controller 110. Once the etch depth has been reached, by virtue of the continuous or iterative lookups to the virtual carpet by the controller 110, as the real-time carpet generator 520 continues to process, the etch endpoint processor 526, may identify that the etch depth that is predicted by use of the virtual carpet 220, corresponds to the desired depth etch. At that point, the system will determine that endpoint has been reached.

Figure 10A:
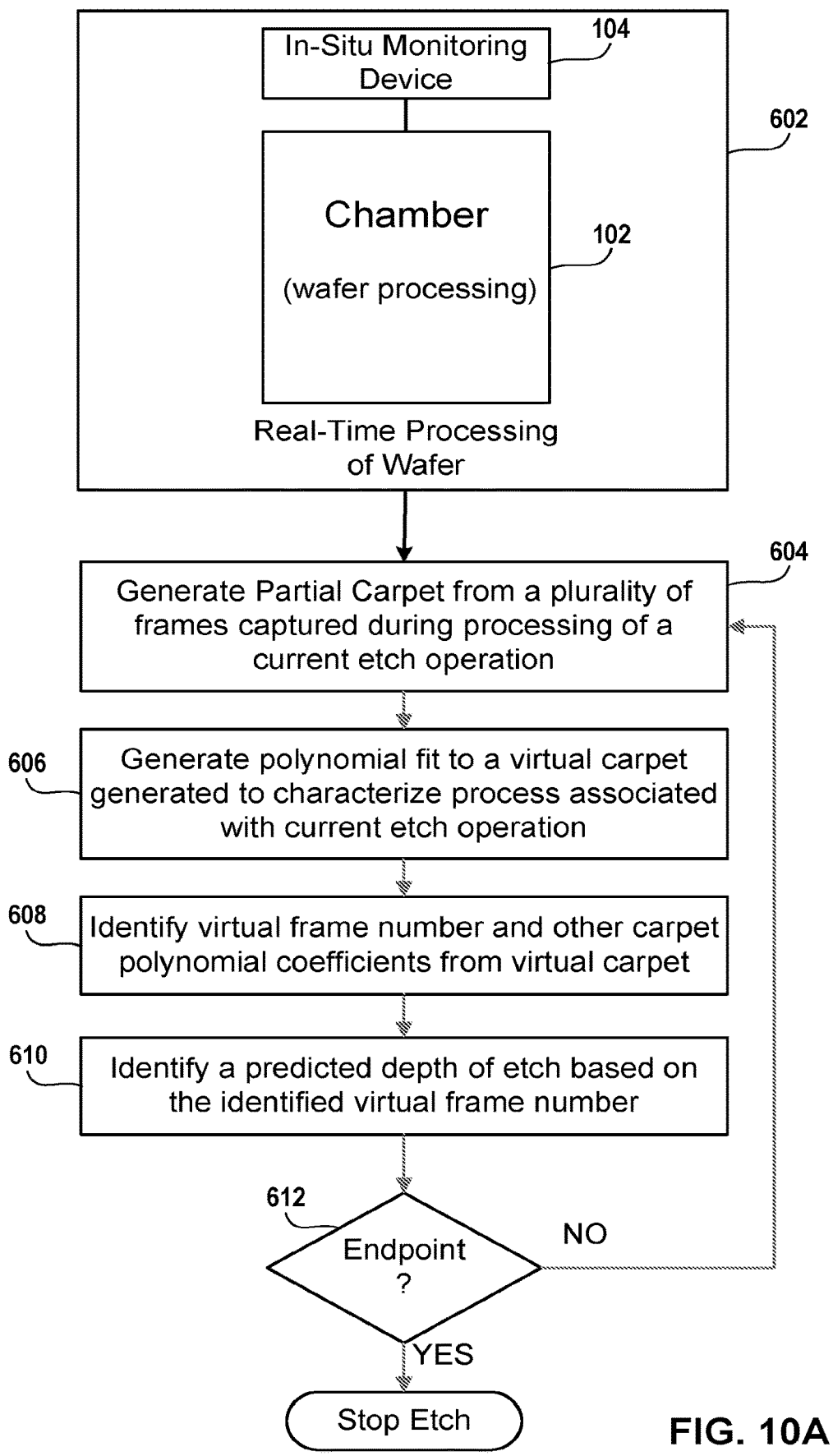
FIG. 10A illustrates an example process where real-time processing of a wafer is being conducted in operation, in accordance with one embodiment.

FIG. 10A illustrates an example process where real-time processing of a wafer is being conducted in operation 602, in accordance with one embodiment. As shown, the real-time wafer processing may be performed by a fabrication chamber, such as chamber 102, that is coupled to or connected to an in-situ monitoring device 104. In some embodiments, the chamber 102 may be installed in a fabrication facility, along with many other chambers. Each of the chambers can themselves be connected to the in-situ monitoring device 104, such that spectral data can be collected for a plurality of frames over a time series.

In operation 604, a partial carpet is generated from the plurality of frames captured during processing of a current etch operation. As mentioned above, during fabrication processing, a carpet is continuously being produced, by adding more and more frames at predefined sampling rates, to define the current carpet. At periodic points in time, which can be programmatically set, the controller of the system or a separate process, can trigger that a polynomial fit of the partial carpet be made to the virtual carpet (i.e., the virtual carpet having been previously generated during training) to characterize the process associated with the current etch operation, as per operation 606. In operation 608, a virtual frame number and other carpet polynomial coefficients are identified from data associated with the virtual carpet.

In operation 610, a predicted depth of etch is identified based on the identified virtual frame number, as shown with reference to the example of FIG. 7. In one embodiment, the prediction of the etch depth will use the virtual frame number as well as other carpet polynomial coefficients. By way of example, at least part of the prediction comes from the virtual frame number, but the polynomial coefficients floated in the run-time process captures the differences of the partial carpets and provides a correction (via the pre-determined loading parameters) to the prediction. In operation 612, it is determined whether endpoint has been reached. If endpoint has not been reached, the system will continue to process another portion of the partial carpet, which includes the last or most currently processed frame, and will proceed through operation 606, 608 and 610, until complete. Once the process end point has been reached, meaning that the desired etch depth has been reached and corresponds to the predicted depth etch in operation 610, the etch operation will be stopped.

Figure 10B:
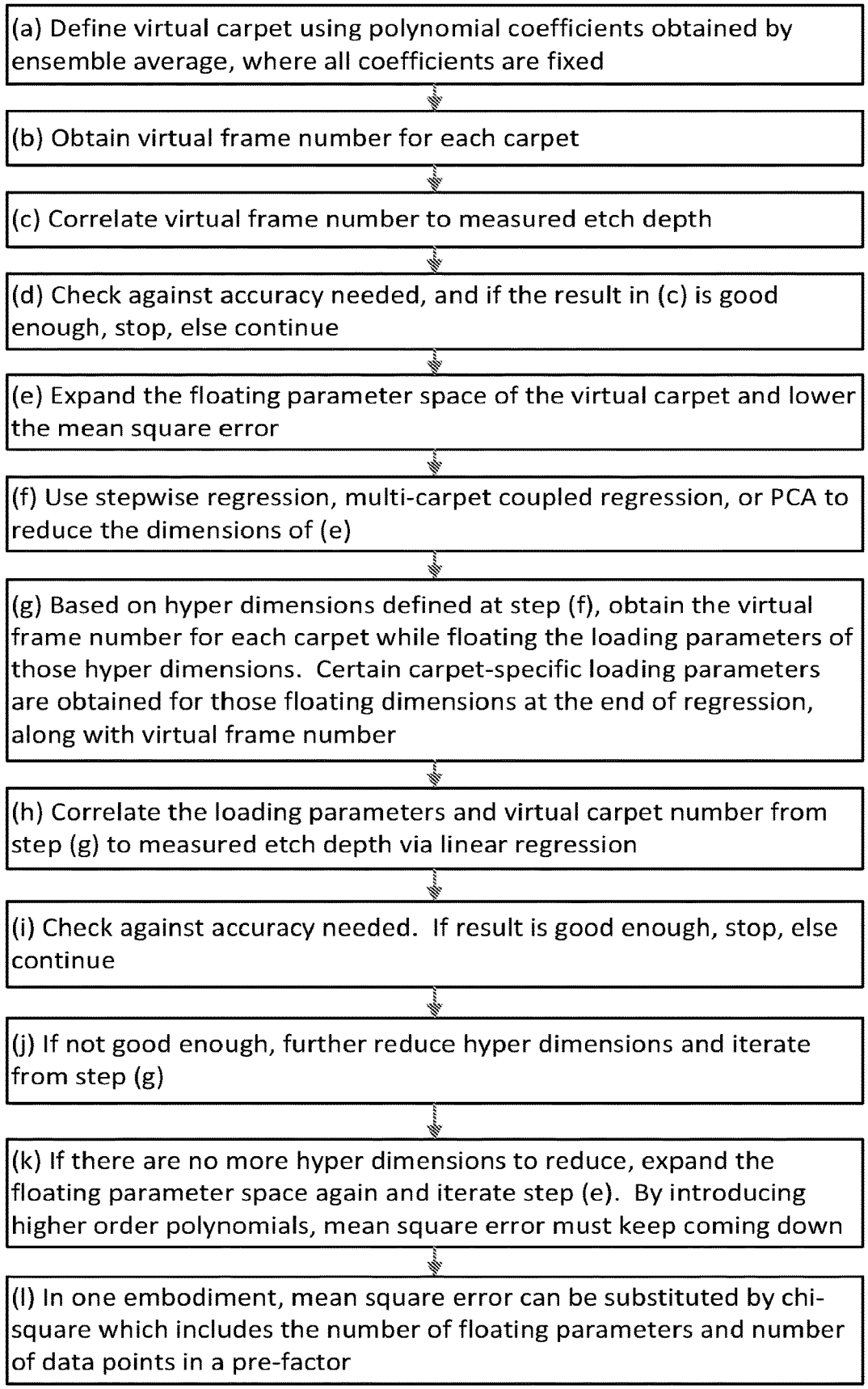
FIG. 10B is a flow chart to illustrate the iterative nature of dimensionality reduction, in accordance with one embodiment.

FIG. 10B is a flow chart to illustrate the iterative nature of dimensionality reduction, in accordance with one embodiment. In operation (a), a virtual carpet is defined using polynomial coefficients obtained by ensemble average, where all coefficients are fixed. As mentioned above, having fixed coefficients is in accordance with one implementation. In operation (b), a virtual frame number for each carpet generated during training is obtained. In one embodiment, one virtual frame number is obtained for each training carpet to generate an X/Y scatter plot with measured etch depth, to determine slope and intercept. This provides for the correlation, as discussed in this application.

In operation (c), the virtual frame number is correlated only to measured etch depth. In this example, up to operation (c), when all of the virtual carpet polynomial coefficients are fixed, there is only virtual frame number that would vary out of virtual carpet fitting. Thus, this only this information is used to correlate with measured etch depth and check against prediction accuracy. If it is not good, as in (d) below, the process will need to start to introduce floating parameters to the virtual carpet which would be determined along with virtual frame number, again one set of parameters per training carpet. We would then use VFN+1, VFN+2, . . . VFN+q parameters to predict measured etch depth. This process is referred to as feature extraction.

Thus, in operation (d), a check is made against a predefined accuracy that is needed. If result of step (c) is good enough, the process stops. This means that the virtual carpet is accurately predicting etch depth. If the accuracy needed is not being reached, in operation (e) the floating parameter space of the virtual carpet and lower the mean square error is expanded. In operation (f), stepwise regression, multi-carpet coupled regression, or PCA is used to reduce the dimensions obtained in (e).

In operation (g), based on hyper dimensions defined at step (f), the process proceeds to obtain the virtual frame number for each carpet generated during training while floating the loading parameters of those hyper dimensions. As can be appreciated, multiple steps of virtual carpet evaluation occur during the training process. Thus, we are iteratively improving the quality of virtual carpet correlation against measured depth. Within each iteration of (e)-(i), we redefine virtual carpet dimensions. Further, certain carpet-specific loading parameters are obtained for those floating dimensions at the end of regression, along with virtual frame number. In operation (h), correlation is performed of the loading parameters and virtual carpet number from step (g) to measured etch depth via linear regression. In operation (i) a check against accuracy is needed. If result is good enough, stop. As used herein, "good enough" means the difference of a supervised training and reference metrology is small enough, such that in situ process control using a virtual carpet is considered a valid replacement of a standalone ex-situ metrology system.

If the results in (i) are not good enough, then in operation (j), further reduce hyper dimensions and iterate from operation (g).

In operation (k), if there are no more hyper dimensions to reduce, expand the floating parameter space again and iterate operation (e). By introducing higher order polynomials, mean square error will keep coming down. In operation (1), in one embodiment, mean square error (MSE), can be substituted by an unbiased estimate of error variance, e.g., the residual sum of squares divided by the number of degrees of freedom.

Although specific examples were provided regarding the generation of carpets using measured broadband in-situ reflectometry spectra, still other methods of measuring can be used. Further, laser methods like laser absorption spectrometry may be used. In one example, laser absorption with a carpet on integration band or laser absorption spectroscopy with full spectra, may be used. In still other embodiments, RF signals which also have frequency spectra that are known to display similar complicated carpet behaviors related to both on-wafer metric changes, chamber parts, plasma impedance (chemistry) changes, may also be amenable to the analyses disclosed. In regard to RF signals, it is believed that metrics obtained will be less about endpoint and more about or useful for chamber matching/metrification.

In some embodiments, the spectral data that is collects is associated with light or laser interferometry, or reflectometry and absorption, or OES, or RF voltage and current traces themselves or mathematically transformed into RF spectral amplitude. In one embodiment, the spectral data is collected from a chamber used for etching while a feature is being etched on a wafer.

In still other embodiments, more data streams can be put together to make synthetic 'spectra' that have carpet like behaviors. One usefulness of using a carpet, as described herein, is the physically constrained strong correlation and continuity relationships between any spectral element and its near-spectral-dimension neighbor and its near-temporal-dimension neighbors. If different tool data is used in conjunction with the spectra collected, the law-of-nature-enforced continuity of correlation in 'spectral' and 'temporal' space may be reduced. This is because the tool-data variables are not necessarily 'near' each other due to physics. In one embodiment, it is possible to sort the tool data to either find the physics to put tool-data variables 'next to' each other or we would need to mathematically select and order the variables so 'by discovery' for a 'good operating tool' the variables so arranged, in a 'pseudo-spectra' known to have 'spectro-temporal' correlation and continuity.

In this manner, it is possible to use carpet processing to call control actions and detect differences between tools. In one embodiment, the controller 110, described with reference to FIGS. 1 and 9 above may include a processor, memory, software logic, hardware logic and input and output subsystems from communicating with, monitoring and controlling a plasma processing system. The controller 110 may also handle processing of one or more recipes including multiple set points for various operating parameters (e.g., voltage, current, frequency, pressure, flow rate, power, temperature, etc.), e.g., for operating a plasma processing system. Furthermore, although more detailed examples were provide with reference to etching operations (e.g., etching tools), it should be understood that the operations can equally be utilized for deposition operations (e.g., deposition tools). For example, in the verification operations, instead of verifying etch performance, the verification can be of deposition performance. Deposition performance can be quantified in various ways, and without limitation, various types of metrology methods and/or tools may be used. Furthermore, deposition performance may be measured, sensed, approximated, and/or tested in-situ or off-line.

In some implementations, a controller 110 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 110, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 110 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 110 in the form of various individual settings (or program files), defining operational parameters for carrying out a particular process on or for a semiconductor wafer or to a system. The operational parameters may, in some embodiments, be part of a recipe defined by a process that is engineered to accomplish one or more processing steps during the fabrication of one or more layers, materials, metals, oxides, silicon, silicon dioxide, surfaces, circuits, and/or dies of a wafer.

The controller 110, in some implementations, may be a part of or coupled to a computer that is integrated with, coupled to the system, otherwise networked to the system, or a combination thereof. For example, the controller 110 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer.

In some examples, the controller 110 receives instructions in the form of data, which specify parameters for each of the processing steps to be performed during one or more operations. It should be understood that the parameters may be specific to the type of process to be performed and the type of tool that the controller 110 is configured to interface with or control. Thus as described above, the controller 110 may be distributed, such as by comprising one or more discrete controller 110s that are networked together and working towards a common purpose, such as the processes and controls described herein. An example of a distributed controller 110 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 110 might communicate with one or more of other tool circuits or modules, other tool components, cluster tools, other tool interfaces, adjacent tools, neighboring tools, tools located throughout a factory, a main computer, another controller 110, or tools used in material transport that bring containers of wafers to and from tool locations and/or load ports in a semiconductor manufacturing factory.

FIG. 11 is a simplified schematic diagram of a computer system for implementing embodiments. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 704, which is coupled through bus 710 to random access memory (RAM) 706, read-only memory (ROM) 712, and mass storage device 714. System controller program 708 resides in random access memory (RAM) 706, but can also reside in mass storage 714.

Mass storage device 714 represents a persistent data storage device such as a floppy disc drive or a fixed disc drive, which may be local or remote. Network interface 730 provides connections via network 732, allowing communications with other devices. It should be appreciated that CPU 704 may be embodied in a general-purpose processor, a special purpose processor, or a specially programmed logic device. Input/Output (I/O) interface provides communication with different peripherals and is connected with CPU 704, RAM 706, ROM 712, and mass storage device 714, through bus 710. Sample peripherals include display 718, keyboard 722, cursor control 724, removable media device 734, etc.

Display 718 is configured to display the user interfaces described herein. Keyboard 722, cursor control 724, removable media device 734, and other peripherals are coupled to I/O interface 720 in order to communicate information in command selections to CPU 704. It should be appreciated that data to and from external devices may be communicated through I/O interface 720. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relate to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

For more information on methods for monitoring process conditions and methods for adjusting settings, reference may be made to U.S. Provisional Patent Application No. 62/370, 658, filed on Aug. 3, 2016, entitled "Methods and Systems for Monitoring Plasma Processing Systems and Advanced Process and Tool Control," U.S. Pat. No. 6,622,286, entitled "Integrated electronic hardware for wafer processing control and diagnostic," U.S. Pat. No. 8,295,966, entitled "Methods and apparatus to predict etch rate uniformity for qualification of a plasma chamber," U.S. Pat. No. 8,983,631, entitled "Arrangement for identifying uncontrolled events at the process module level and methods thereof," U.S. Pat. No. 8,473,089, entitled "Methods and apparatus for predictive preventive maintenance of processing chambers," U.S. Pat. No. 8,271,121, entitled "Methods and arrangements for in-situ process monitoring and control for plasma processing tools," and U.S. Pat. No. 8,538,572, entitled "Methods for constructing an optimal endpoint algorithm," all of which are assigned to Lam Research Corporation, the assignee of the present application and each of which are incorporated herein for all purposes.

For additional information regarding machine learning algorithms, phenomenological models and associated processes, reference may be made to a Theses entitled *"Virtual Metrology for Semiconductor Manufacturing Applications,"* by Bertorelle Nicola, University of Padua, Department of Information Engineering, dated 28 Jun. 2010; a Theses entitled *"Statistical Methods for Semiconductor Manufacturing,"* by Gian Antonio Susto, Universita Degli Studi di Padova, School in Information Engineering, January 2013; and a paper entitled *"Etching characteristics and mechanisms of the MgO thin films in the CF4/Ar inductively coupled plasma,"* by A. Efremov, et al. Department of Electronic Devices and Materials Technology, Sate University of Chemistry and Technology, 7, F. Engels St., 15300 Ivanovo, Russia, Jan. 12, 2007, each of which is herein incorporated by reference.

Further, embodiments and any specific features described in the above incorporated by reference documents and applications may be combined with one or more features described herein, to define or enable specific embodiments.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method, comprising,
accessing a virtual carpet that is generated from a time-series of spectra for an etch process collected during a training, the training producing a polynomial with coefficients that represent the virtual carpet;
running a fabrication etch process on a fabrication wafer, such that while the fabrication etch process is performed portions of a carpet defined from a time-series of spectra is generated for the fabrication etch process;
comparing the portions of the carpet of the fabrication etch process to the virtual carpet; and
triggering an endpoint of the fabrication etch process when said comparing indicates that a desired etch metric has been reached;
wherein the portions of the carpet of the fabrication etch process are fitted to the virtual carpet to identify a virtual frame number in the virtual carpet that is correlated to a predicted value for said etch metric.

2. The method of claim 1, wherein said portions of the carpet and the virtual carpet include frames associated with specific times.

3. The method of claim 1, wherein the etch metric is associated with at least one of a predefined etch depth, a predefined critical dimension value, a predefined wafer bow value, a predetermined line width value, a predefined feature pitch value, a predefined features spacing value, or predetermined measurable value or a combination of two or more thereof.

4. The method of claim 1, wherein each portion of said carpet includes at least two frames and each portion is a patch of the carpet.

5. The method of claim 1, wherein the coefficients of the polynomial are processed by a dimensionality reduction algorithm to produce the virtual carpet.

6. The method of claim 5, wherein the polynomial of the virtual carpet is a standardized polynomial with respective coefficients that are a superset of coefficients obtained from carpets produced during said training.

7. The method of claim 1, wherein at least some of the coefficients of the virtual carpet are floating parameters and others are fixed or coupled to the floating parameters.

8. The method of claim 7, wherein said floating parameters in addition to the virtual frame number are used to map to the predicted value for the etch metric.

9. The method of claim 1, wherein the time-series of spectra is intensity spectral data associated with broadband in-situ reflectometry, or is intensity spectral data associated with Optical Emission Spectroscopy (OES), or is ellipsometric spectral data associated with broadband in-situ ellipsometry, wherein said spectral data is collected from a chamber used for etching while a feature is being etched on a wafer.

10. A method, comprising,
accessing a virtual carpet that is generated from a time-series of spectra for an etch process, a polynomial with coefficients representing the virtual carpet;
processing a fabrication etch process on a fabrication wafer; and
generating a carpet defined from a time-series of spectra while processing the fabrication etch process, and while the processing the fabrication etch process and generating the carpet, comparing portions of the carpet and the virtual carpet to identify an endpoint metric of the fabrication etch process,
wherein the portions of the carpet of the fabrication etch process are fitted to the virtual carpet to identify a virtual frame number in the virtual carpet that is correlated to a predicted value for said endpoint metric.

11. The method of claim 10, wherein said portions of the carpet and the virtual carpet include frames associated with specific times.

12. The method of claim 10, wherein the endpoint metric is associated with at least one of a predefined etch depth, a predefined critical dimension value, a predefined wafer bow value, a predetermined line width value, a predefined feature pitch value, a predefined features spacing value, or predetermined measurable value or a combination of two or more thereof.

13. The method of claim 10, wherein the coefficients of the polynomial are processed by a dimensionality reduction algorithm to produce the virtual carpet.

14. The method of claim 13, wherein the polynomial of the virtual carpet is a standardized polynomial with respective coefficients that are a superset of coefficients obtained from carpets produced during training.

15. The method of claim 10, wherein the time-series of spectra is intensity spectral data associated with broadband in-situ reflectometry, or is intensity spectral data associated with Optical Emission Spectroscopy (OES), or is ellipsometric spectral data associated with broadband in-situ ellipsometry, wherein said spectral data is collected from a chamber used for etching while a feature is being etched on a wafer.

\* \* \* \* \*